United States Patent [19]
Caron

[11] Patent Number: 5,489,840
[45] Date of Patent: Feb. 6, 1996

[54] CONTROL CIRCUIT FOR CONTROLLING VOLTAGE SUPPLY TO ELECTRIC DEVICES

[76] Inventor: Jacques Caron, 9065A Primot Street, St. Leonard, Quebec, Canada, H1R 3A8

[21] Appl. No.: 279,404

[22] Filed: Jul. 25, 1994

[51] Int. Cl.⁶ .............................. G05B 24/02; H02H 3/00
[52] U.S. Cl. ................................ 323/349; 361/93
[58] Field of Search ...................... 323/266, 267, 323/268, 269, 271, 272, 322, 349–351; 361/30, 31, 79, 87, 91, 93, 111, 118; 307/38, 39

[56] References Cited

U.S. PATENT DOCUMENTS

| | | | |
|---|---|---|---|
| 4,384,213 | 5/1983 | Bogel | 307/64 |
| 4,475,150 | 10/1984 | D'Atke et al. | 363/51 |
| 4,752,853 | 6/1988 | Matsko et al. | 361/94 |
| 4,916,628 | 4/1990 | Kugler | 364/492 |
| 4,945,443 | 7/1990 | Debiasi et al. | 361/93 |
| 5,254,878 | 10/1993 | Olsen | 323/349 |
| 5,254,937 | 10/1993 | Mizoguchi | 323/349 |
| 5,424,897 | 6/1995 | Mietus et al. | 361/93 |
| 5,426,556 | 6/1995 | Lee et al. | 361/119 |

Primary Examiner—Matthew V. Nguyen

[57] ABSTRACT

A control circuit for controlling the voltage supply to selected ones of a plurality of output terminals to which controllable devices are connected to is described. The control circuit comprises manually operable function switches which are connected to an integrated circuit providing output logic signals to feed an interlock circuit to select the operation of one or more of a plurality of high voltage electronic switching devices. An interface circuit is connected between the switching devices and the interlock circuit to trigger the operation of selected switching devices to connect a high voltage supply to associated ones of the output terminals. The interface circuit also prevents feedback voltage surges from the one or more switching devices to protect electronic circuits in the control circuit. An overcurrent protection circuit is connected between an output of the high voltage electronic switching devices and the integrated circuit to disable the output logic signals and the interlock circuit to cut the high voltage supply at the output terminals when the current exceeds a predetermined reference value.

11 Claims, 2 Drawing Sheets

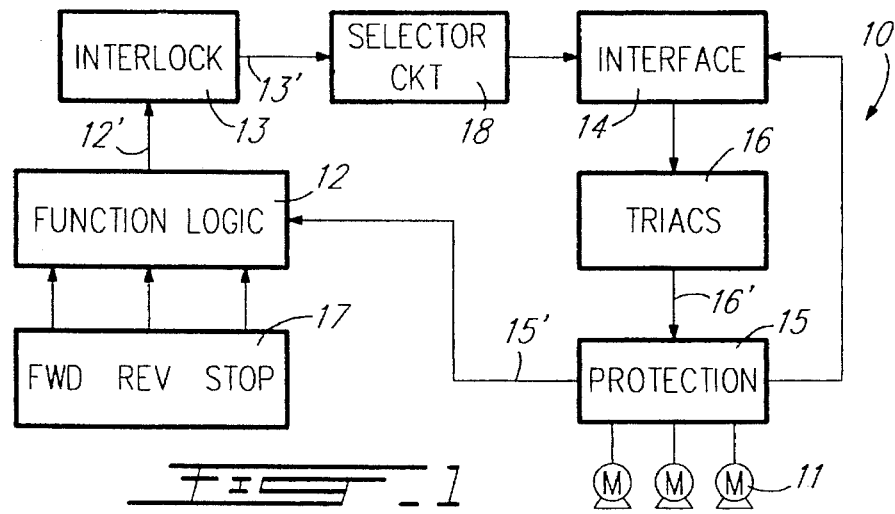
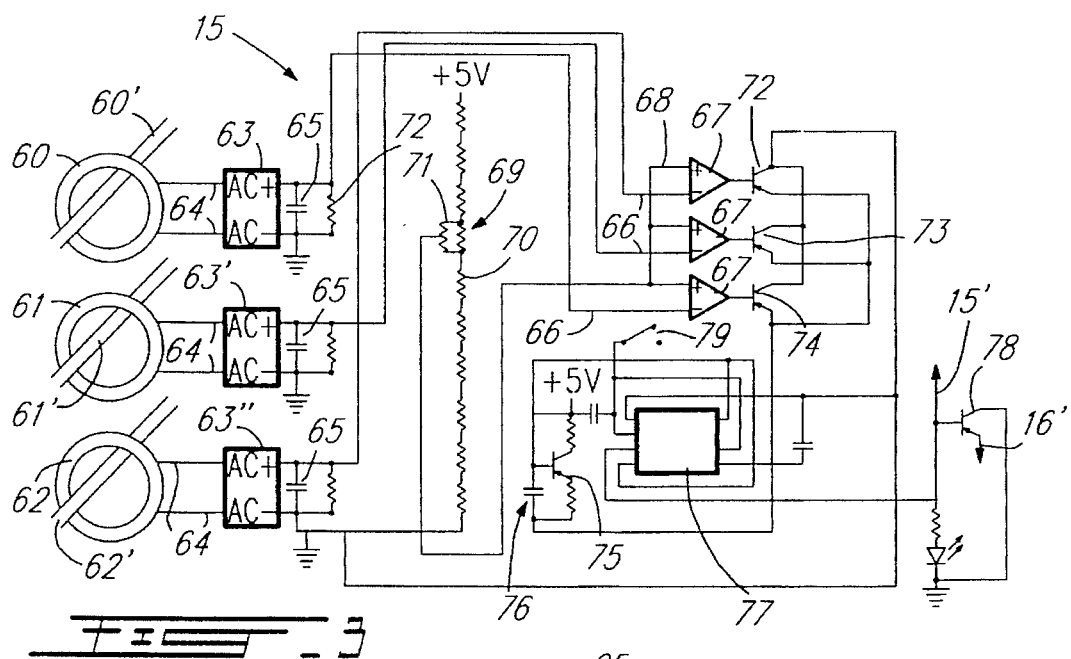
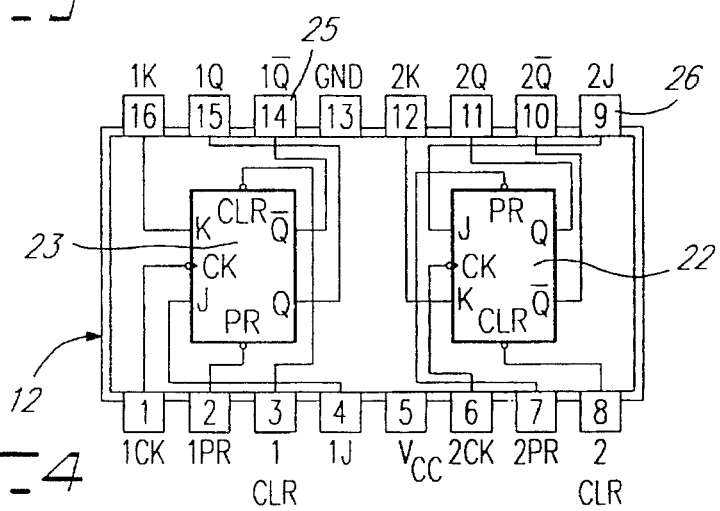

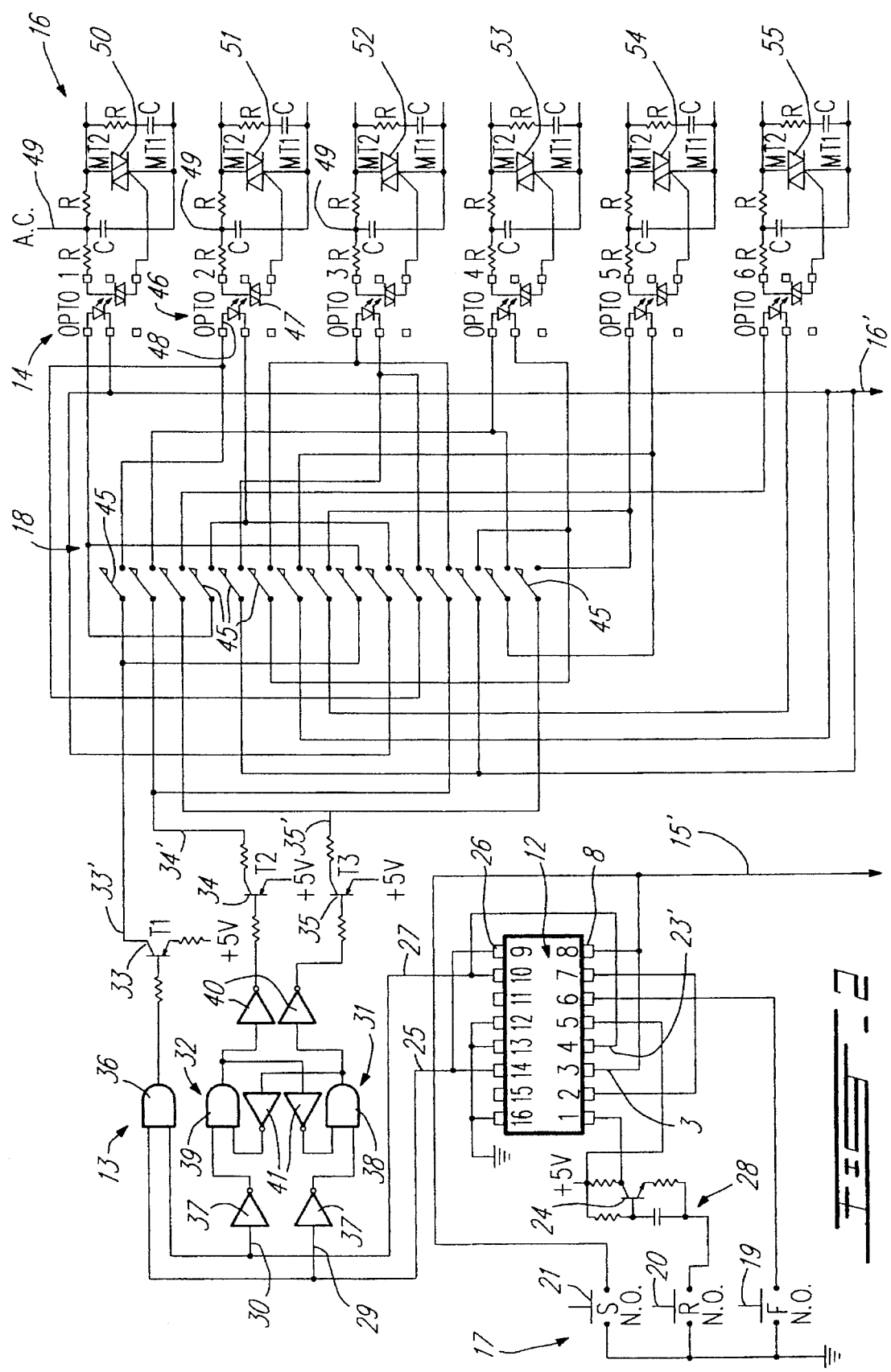

CONTROL CIRCUIT FOR CONTROLLING VOLTAGE SUPPLY TO ELECTRIC DEVICES

TECHNICAL FIELD

The present invention relates to a control circuit for controlling the voltage supply to selected ones of a plurality of output terminals to which controllable devices, such as electric motors, pneumatic or hydraulic valves, etc., are connected to.

The control circuit makes it possible to eliminate conventional wiring from control switches to magnetic starters of electric motors as well as eliminating the use of relays which are utilized to operate such motors when incorporated with conveying apparatus in a motor vehicle assembly line.

BACKGROUND ART

In the automotive industry the manufacturing of automobiles and parts thereof is done on conveying systems which are usually driven by electric motors. The conveying apparatus is actuated, stopped and reversed automatically and also controlled by operators through the use of function switches. Electromechanic contactors are used as sensors and are secured along the conveying apparatus and are actuated at precise moments either to stop, advance or reverse the operation of electric motors to manipulate the articles being processed. These contactors utilize electromagnets with mechanically actuated contacts which are used to switch the current to these electric motors either to drive the motor clockwise, counterclockwise or just to stop the motor. A function switch is provided for each of these functions. Also the more complex the function performed by the conveyor, for example the automatic stoppage and start of a conveying apparatus in one or two directions, the more complex is the wiring between the function switches, the contacts and the motors, and this requires more and more installation time and highly skilled technicians. Also, it leads to more errors in the wiring due to its complexity and requires large enclosures.

Another disadvantage in this prior art apparatus is that electromagnets are used, and these often produce electric arcs, and accordingly protection must be provided when these electromagnets are utilized in areas where there are gases in the air, such as along the paint sections of such production lines. Also, the use of relays and contactors result in mechanical wear which often require servicing. Still further, when retrofitting an assembly line it becomes very difficult and time consuming to re-wire the control system.

SUMMARY OF INVENTION

It is therefore a feature of the present invention to provide a control circuit for controlling the voltage supplied to selected ones of a plurality of controllable devices and which substantially overcomes the above disadvantages of the prior art.

Another feature of the present invention is to provide a control circuit for controlling the voltage supplied to selected ones of a plurality of controllable devices wherein magnetic relays and the wiring thereof and the further wiring between the relays and function switches is eliminated.

Another feature of the present invention is to provide a control circuit for controlling the voltage supplied to selected ones of a plurality of controllable devices to provide a system which is safer to use and eliminates the cause of arcing.

According to the above features, from a broad aspect the present invention provides a control circuit for controlling the voltage supply to selected ones of a plurality of output terminals to which controllable devices are connected. The control circuit comprises manually operable function switches which are connected to an integrated circuit providing output logic signals to feed an interlock circuit to select the operation of one or more of a plurality of high voltage electronic switching devices. An interface circuit is connected between the switching devices and the interlock circuit to enable the operation of the selected switching devices to connect a high voltage supply to associated ones of the output terminals, and to prevent feedback voltage surges from the one or more switching devices to protect electronic circuits in the control circuit. An overcurrent protection circuit is connected between an output of the high voltage electronic switching devices and the integrated circuit to disable the output logic signals and the interlock circuit to cut the high voltage supply at the output terminals when the current exceeds a predetermined reference value.

BRIEF DESCRIPTION OF DRAWINGS

A preferred embodiment of the present invention will now be described with reference to the accompanying drawings in which:

FIG. 1 is a block diagram illustrating the construction of the control circuit of the present invention;

FIG. 2 is a schematic diagram showing the construction of the circuit of FIG. 1 without the overcurrent protection circuit;

FIG. 3 is a schematic diagram of the overcurrent protection circuit; and

FIG. 4 is a block diagram showing the construction of the integrated circuit of FIG. 2.

DESCRIPTION OF PREFERRED EMBODIMENTS

Referring now to the drawings, and more particularly to FIG. 1, there is shown generally at 10 the control circuit of the present invention for controlling electric motors 11 and pneumatic or hydraulic valves (not shown), or other such devices, which may be used to replace electromagnetic switches (not shown) usually utilized in assembly lines of an automotive manufacturing plant. The control circuit is comprised of four basic circuits, namely a logic function circuit 12, an interlock circuit 13, an interface circuit 14, and an overcurrent protection circuit 15. The supply voltage for the electric motors 11 is provided by a triac circuit 16 the operation of which is controlled by the signals on the output 12' of the logic function circuit. Function switches 17 provide the control signals on the output 12' of the logic function circuit 12. This logic function circuit is also controlled by the signal on the output 15' of the overcurrent protection circuit 15. The selector circuit 18 provided between the interlock circuit 13 and the interface circuit 14 provides the connecting link between the various signals at the output 13' of the interlock circuit 13 and the triac circuit 16, and hence which motor or motors will be fed the control signal and placed in operation or stopped.

Referring now to FIG. 2, there is shown the schematic diagram illustrating the construction of the control circuit but without the overcurrent protection circuit 15 which appears in FIG. 3. As herein shown, the function switches 17 in this application consist of three manually operated switches, namely a start or forward switch 19, a reverse switch 20, and a stop switch 21. The three switches are connected to the logic function circuit 12 which consists of a dual J-K negative edge triggered flip-flop circuit with preset and clear functions, as illustrated in FIG. 4.

As shown in FIG. 4, the logic function circuit 12 utilizes TTL logic (transistor/transistor logic) and a transistor 24. The TTL is composed of two flip-flops 22 and 23 which are interconnected together so that when one of them is enabled, the other is disabled. The circuits are maintained in this state until the enabled flip-flop is placed to its initial state. When controlling a single motor the transistor 24 is utilized as a delay in order to assure that only one of the flip-flops can be placed in a changed state. However, if a plurality of motors need to be controlled, it is possible to change the state of both flip-flops at the same time and to maintain them in that state.

We will now describe the operation of the control circuit. When the start switch 19 is depressed by an operator a signal is sent to pin 6 of integrated circuit 12 and which pin connects to the clock pin of flip-flop 22 (see FIG. 4). The clock pin of flip-flop 23 is connected to pin 1, which in turn connects to the cathode of the transistor 24 of the delay circuit 28, and establishes a delay of 5 seconds. Thereafter, the transistor 24 provides a zero state signal to the flip-flop 23 which causes it to change state. The output 25 of the flip-flop 23 is also connected to an input 26 of flip-flop 22 and thereby interlocks the integrated circuit in this state. Similarly, when the operator depresses the reverse switch 20 a low state (zero) is applied to the flip-flop 22 which also causes it to change state. The output 27 of the flip-flop 22 is also connected to the input 23' (pin 4) of the flip-flop 23 and locks the integrated circuit in that state.

Because the stop switch 21 is connected to the "CLR" (clear) pin of both flip-flops 22 and 23 (their pins 3 and 8) respectively, by depressing switch 21 a 0-volt signal is applied to the flip-flops placing them both in their initial state. If both switches 19 and 20 were to be actuated at the same time, the pulse signal of switch 19 would arrive at the integrated circuit 12 before the pulse signal of switch 20 due to the delay circuit 28, incorporating transistor 24, being secured between the switch 20 and the integrated circuit 12, and this permits the flip-flop 22 to change state.

The output signals on the outputs 25 and 27 of both flip-flops 23 and 22 are connected respectively to the inputs 29 and 30 of two AND gate circuits 31 and 32 of the interlock circuit 13. These AND gate circuits therefore recognize which of the flip-flops has undergone a change of state, that is to say, which of the flip-flops 22 or 23 has been actuated. If it is flip-flop 23, then the switching transistors 33 and 34 are commuted. On the other hand if it is flip-flop 22, then switching transistors 33 and 35 have been commuted. As herein shown, the outputs 25 and 27 of the flip-flops are both connected to an AND gate 36 which operates a switching transistor 33 whenever output signals appear on these outputs 25 and 27. The AND gate circuits 31 and 32 are provided with inverters 37 at the inputs of their AND gates 38 and 39 respectively. Further inverters 40 are also connected at their outputs. The inverters 41 connected between the output of the AND gates 38 and 39 and one of their inputs assures that one of the AND gates is disabled while the other one is conducting.

The outputs 33', 34', 35' of the switching transistors 33, 34 and 35 are connected to the selector circuit 18 which consists of a plurality of switches 45 which are preset to interconnect the control signals at these outputs 33', 34', and 35' to various ones of the triacs 50 to 55 provided in the triac circuit 16.

These triacs are used as high voltage switches to connect an AC voltage supply, provided on their inputs 49, to feed their respective motors 11. As herein shown, the output 33' of switching transistor 33 is connected to switch contact 45', which when in a closed condition connects to the IRED terminal of opto-coupler 46. The IRED is a galleon arsenate infrared LED actuated by the current on the output 33', and it excites the detector chip 47 of the opto-coupler 46. It will also operate the other opto-couplers 46 connected thereto through the switches 45 which are closed. The opto-triacs also operate their respective triacs 50 to 55 which in turn connect the AC supply to the motors. Because these interface opto-triacs are disposed between the triacs and the electronic circuits 12 and 13, they also prevent any feedback voltage surges, due to the optical link offered by the opto-couplers 46, and thereby protects the electronic control circuits.

Referring now to FIG. 3 there will be described the construction and operation of the overcurrent protection circuit 15. This circuit is herein shown as having three input detector coils 60, 61 and 62 at its input, each of which encircles a conductor 60', 61' and 62' of a three-phase AC supply connected to the supply terminal 49 of the triacs 50 to 55. Of course, in a two-phase AC supply there would only be two detector coils and associated circuitry. These detector coils 60 to 62 are respectively connected to a diode bridge 63, 63' and 63" where the input voltage signal at its input 64 is fullwave rectified and filtered by the filter 65 at their output. The signal at the inputs 64 is a magnetically induced signal captured by the coils 60, 61 and 62. The output signals of these diode bridges is a DC voltage signal which is fed to the respective inputs 66 of the comparators 67. The other input 68 of the comparators is fed a reference voltage which is selected by a potentiometer 69 consisting of a plurality of serially connected resistors 70. The tap 71 is selected depending on the horsepower of the motor which is being fed by the supply lines. In this particular potentiometer 69 there are nineteen resistors, although fewer are herein shown for simplicity. The resistors 70 provide calibration of the amperage of the reference signal which is compared with the error voltage signal obtained from the coils. The calibration is set at 0.1V=1A. It is foreseeable that miniature switches, like in FIG. 2, be connected in parallel with the resistances 70 to preselect the proper calibration for the specific horsepower of the motor being fed by the supply lines.

When the voltage on the inputs 66 of the comparator 67 exceeds the reference voltage on the inputs 68, the transistors 72 to 74 are commuted and provide a 1-second delay. This 1-second delay permits the elimination of the variations in current due to motor start-up to disregard these so that they do not provide a false signal. They are this way disregarded from those error signals representative of overcurrent that could damage the motors. Accordingly, when the delay is over transistor 75 of delay circuit 76 sends a pulse to the integrated circuit 77 which is in a monostable mode. The integrated circuit then actuates transistor 78 which transistor will cut the supply to the interface circuit 14 due to its output 15' being connected to the integrated circuit 12 causing that integrated circuit to disable its flip-flops reverting them back to their initial state with the outputs 25 and 27 of the flip-flops maintaining the interlock circuit disabled. When such overcurrent has been detected and the circuit is switched off, in order to reactivate the circuit it is necessary to depress the reset switch 79 which sends an impulse to the input of the integrated circuit 77. This signal permits the flip-flops (not shown) of the integrated circuit 77 to be placed in their initial state and render them operational.

It is within the ambit of the present invention to cover any obvious modifications of the preferred embodiment described herein, provided such modifications fall within the scope of the appended claims.

I claim:

1. A control circuit for controlling the voltage supply to selected ones of a plurality of output terminals to which controllable devices or circuits are connected, said control circuit comprising presetable function switches, said function switches being coupled to an integrated circuit providing output logic signals to feed an interlock circuit to select the operation of at least one of a plurality of high voltage electronic switching devices, an interface circuit connected between said switching devices and said interlock circuit to trigger the operation of said selected switching devices to connect a high voltage supply to associated ones of said output terminals, and to prevent feedback voltage surges from said at least one switching device to protect electronic circuits in said control circuit, and an overcurrent protection circuit connected between an output of said high voltage electronic switching devices and said integrated circuit to disable said output logic signals and said interlock circuit to cut said high voltage supply at said output terminals when the current flowing through said high voltage electronic switching devices exceeds a predetermined reference value.

2. A control circuit as claimed in claim 1 wherein said interlock circuit is provided with a gating circuit to operate selected ones of driving transistors connected to selected ones of preset switches connected to at least one of said plurality of high voltage electronic switching devices through said interface circuit.

3. A control circuit as claimed in claim 2 wherein said interface circuit comprises a plurality of opto-couplers connected to a respective one of said high voltage electronic switches.

4. A control circuit as claimed in claim 3 wherein said driving transistors provide the supply to operate the IRED of said opto-couplers which in turn excites a detector chip of said opto-coupler to drive an associated triac, said associated triac constituting one of said high voltage electronic switching devices.

5. A control circuit as claimed in claim 2 wherein said interlock gating circuit is comprised of AND gates and inverters to provide enabling bias signals to said switching transistors.

6. A control circuit as claimed in claim 2 wherein said overcurrent protection circuit comprises input detector coils connected to respective ones of supply lines connected to said high voltage electronic switching devices to provide an error signal representative of the magnitude of the current flowing in said supply lines, said error signal being fed to a first input terminal of a comparator, a reference signal circuit connected to a second input of said comparator to feed a reference signal thereto, a further switching transistor connected to the output of said comparator and feeding an integrated circuit which controls a transistor switch which disables said output logic signals.

7. A control circuit as claimed in claim 6 wherein said controllable devices are electric motors, said overcurrent protection circuit having a delay circuit connected to an output of said further switching transistor, said delay circuit having an RC circuit to provide a predetermined time delay to discard false error signals produced by motor start-up.

8. A control circuit as claimed in claim 7 wherein said reference signal circuit has a potentiometer to preselect said reference signal depending on the horsepower of said motor being fed by said supply lines.

9. A control circuit as claimed in claim 1 wherein said controllable devices are electric motors driving conveying apparatus, said function switches comprising a forward, stop and reverse switch, said integrated circuit having dual J-K negative edge triggered flip-flops so that when one is conductive the other is inoperative to prevent the operation of further high voltage electronic switching devices during operation of said at least one selected switching device.

10. A control circuit as claimed in claim 9 wherein said stop switch is connected to both flip-flops to place them in their initial state to disable said switching devices.

11. A control circuit as claimed in claim 9 wherein said reverse switch is connected to said flip-flops to reverse their actual state, a delay circuit connected between said reverse switch and said flip-flops to prevent both flip-flops to have enabling signals at their respective outputs at the same time.

* * * * *